(12) United States Patent
Abe et al.

(10) Patent No.: US 10,396,767 B2
(45) Date of Patent: Aug. 27, 2019

(54) SEMICONDUCTOR DEVICE

(71) Applicant: FUJI ELECTRIC CO., LTD., Kawasaki (JP)

(72) Inventors: Yuya Abe, Matsumoto (JP); Takanori Kohama, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 217 days.

(21) Appl. No.: 15/637,968

(22) Filed: Jun. 29, 2017

(65) Prior Publication Data
US 2018/0026614 A1 Jan. 25, 2018

(30) Foreign Application Priority Data
Jul. 19, 2016 (JP) .................................. 2016-141527

(51) Int. Cl.
*H03K 5/153* (2006.01)
(52) U.S. Cl.
CPC .................................. *H03K 5/153* (2013.01)
(58) Field of Classification Search
CPC ........... H03K 5/13; H03K 5/135; H03K 5/153
See application file for complete search history.

(56) References Cited

U.S. PATENT DOCUMENTS

| | | | |
|---|---|---|---|
| 2010/0194452 A1* | 8/2010 | Hara | H03K 19/003 327/142 |
| 2013/0321029 A1 | 12/2013 | Abe et al. | |
| 2014/0043006 A1* | 2/2014 | Tan | H02M 3/157 323/298 |
| 2016/0105001 A1 | 4/2016 | Obe | |

FOREIGN PATENT DOCUMENTS

| | | |
|---|---|---|
| JP | 2013-243500 | 12/2013 |
| JP | 2016-75253 | 5/2016 |

* cited by examiner

*Primary Examiner* — Lincoln D Donovan
*Assistant Examiner* — Diana J. Cheng

(57) ABSTRACT

A semiconductor device includes an input determination circuit. The input determination circuit includes: a comparator that is driven based on a first reference potential and includes an input voltage terminal and a reference voltage terminal; a reference voltage generation circuit that inputs a reference voltage that is generated from a connection point between a constant current source and a resistor to the reference voltage terminal of the comparator, the constant current source and the resistor being interposed between a second reference potential that is separated from the first reference potential and a third potential that is higher than the first reference potential and the second reference potential; and a first low pass filter that is interposed between a signal input system that is connected to the input voltage terminal of the comparator and the second reference potential.

9 Claims, 3 Drawing Sheets

SEMICONDUCTOR DEVICE

REFERENCE

This application claims benefit of priority under 35 USC 119 based on Japanese Patent Application No. 2016-141527 filed on Jul. 19, 2016, the entire contents of which are incorporated by reference herein.

TECHNICAL FIELD

The present invention relates to a semiconductor device including an input determination circuit for determining an input signal level.

BACKGROUND ART

In general, a semiconductor device that drives a semiconductor switching element based on an input signal is provided with an input determination circuit that includes a comparator for determining an input signal voltage level. In addition, when a power switch capable of flowing a large current therethrough, which is represented by an insulated gate bipolar transistor (hereinafter, referred to as an IGBT), is driven, there is a case in which, since a minute resistance component in wiring and the like serving as a current path may not be ignored and, for example, the potential of a ground in the vicinity of the power switching element increases by the product obtained by multiplying the minute resistance by a large current, which sometimes causes a malfunction, the ground is used separately from a ground for signal transmission (see, for example, JP 5900149 B).

An input determination circuit disclosed in JP 5900149 B includes a comparator 102 that is connected between a DC input terminal 101 and a ground GND1 having a first reference potential G1 and is supplied with DC electric power, as illustrated in FIG. 6. The input determination circuit is configured to compare an input signal voltage Vin input from an ECU 103 with a reference signal voltage Vref by means of the comparator 102 to perform level determination. In the input determination circuit, the reference voltage Vref that is input to the comparator 102 is output from the connection point between a constant current circuit 105 and a resistor 106 that are connected between the DC input terminal 101 and a ground GND2 having a second reference potential G2 that is different from the first reference potential. In addition, a series circuit of a constant current circuit 107 and a P-channel MOSFET 108 is connected in parallel with the constant current circuit 105, and a determination signal Sj output from the comparator 102 is supplied to the gate of the P-channel MOSFET 108. The above configuration causes the input signal voltage Vin and the reference signal voltage Vref to be formed at an identical reference potential (the ground GND2), which enables the comparator 102 to perform input determination with high accuracy.

SUMMARY OF INVENTION

In the input determination circuit disclosed in JP 5900149 B, even when the potential of a reference voltage source and a drive voltage for the comparator fluctuate, an input signal voltage can be determined correctly with a difference in potentials between the input signal voltage and the reference signal voltage kept constant unless the input signal voltage departs from the in-phase input voltage range of the comparator. However, there is a problem that, since an input signal from the ECU is supplied directly to the input voltage terminal of the comparator, when a surge voltage and a noise are superimposed on the input signal, determination results are influenced by the surge voltage and the high frequency noise.

On the other hand, in the input determination circuit disclosed in PTL 1, in order to remove a surge voltage and a high frequency noise, it is conceivable to connect a capacitor 109 serving as a countermeasure against noises between the connection point between the resistor 106 and the ground GND2 and the connection point between the comparator 102 and the ground GND1, as illustrated in FIG. 6. Although, to remove noises sufficiently, it is originally needed to also interpose a capacitor between the input signal voltage VIN and the ground GND1, it has been confirmed that using only the capacitor 109 provides sufficient resistance against noises.

However, there is a problem that, since, to take a countermeasure against noises using the capacitor 109 connected between the grounds GND1 and GND2, the capacitor 109 is needed to have a capacitance of approximately several tens of nF, the capacitor is made too large to be built in a semiconductor chip and is caused to be arranged externally, which leads to an increase in the number of components.

Accordingly, an object of the present invention is to provide a semiconductor device including an input determination circuit that is capable of, without arranging a capacitor externally, removing a surge voltage and a high frequency noise.

In order to achieve the object mentioned above, according to an aspect of the present invention, there is provided a semiconductor device including an input determination circuit. The input determination includes: a comparator that is driven based on a first reference potential and includes an input voltage terminal and a reference voltage terminal; a reference voltage generation circuit that inputs a reference voltage that is generated from a connection point between a constant current source and a resistor to the reference voltage terminal of the comparator, the constant current source and the resistor being interposed between a second reference potential that is separated from the first reference potential and a third potential that is higher than the first reference potential and the second reference potential; and a low pass filter that is interposed between a signal input system that is connected to the input voltage terminal of the comparator and the first reference potential or the second reference potential.

According to the aspect of the present invention, it is possible to stably determine an input signal level without arranging a capacitor externally and without being influenced by a surge voltage and a high frequency noise. Therefore, it is possible to manufacture the semiconductor device at a low cost while keeping its function.

The object and advantages of the invention will be realized and attained by means of the elements and combinations particularly pointed out in the claims. It is to be understood that both the foregoing general description and the following detailed description are exemplary and explanatory and are not restrictive of the invention.

DETAILED DESCRIPTION

Figure 1:
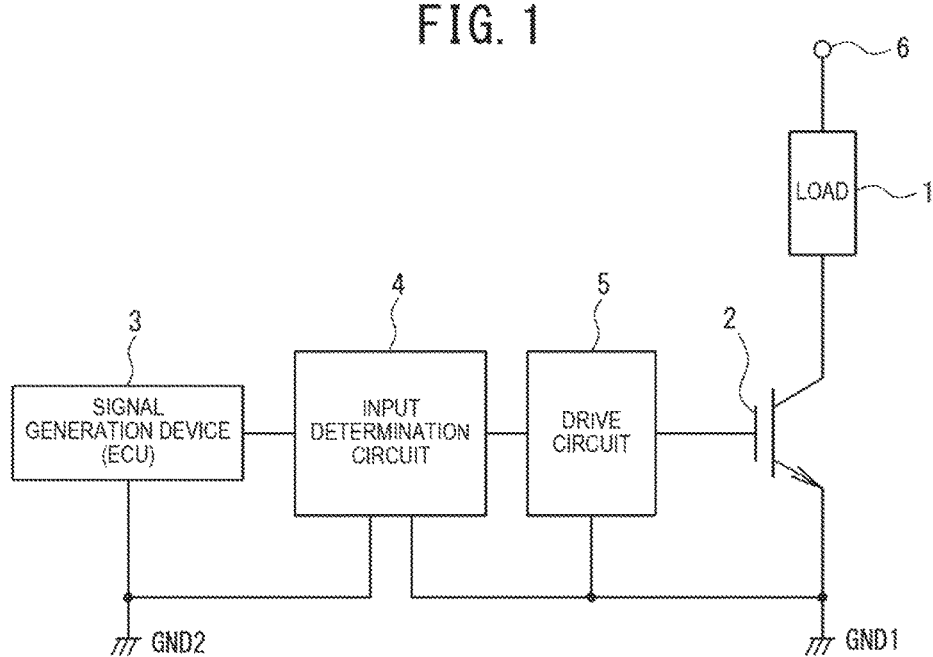
FIG. 1 is a circuit diagram illustrative of an embodiment of a semiconductor device according to the present invention.

An embodiment of the present invention will now be described with reference to the drawings. In the following description of the drawings, the same or similar reference signs are assigned to the same or similar constituent components.

In addition, the following embodiments exemplify devices and methods to embody the technical idea of the present invention, and the technical idea of the present invention does not limit the materials, shapes, structures, arrangements, and the like of the constituent components to those described below. The technical idea of the present invention can be subjected to a variety of alterations within the technical scope prescribed by the claims described in CLAIMS.

Hereinafter, a semiconductor device including an input determination circuit according to a first embodiment in accordance with the present invention will be described using FIG. 1.

The semiconductor device according to the first embodiment of the present invention is used in, for example, an igniter that drives an inductive load of an ignition coil. The semiconductor device includes an IGBT 2 that drives an inductive load 1. The semiconductor device also includes a signal generation device 3 that outputs a signal for turning the IGBT 2 on and off, an input determination circuit 4 that determines a voltage level of an input signal output from the signal generation device 3 to recognize the ON/OFF state of the input signal, and a drive circuit 5 that controls and drives the IGBT 2 based on a determination output from the input determination circuit 4.

The collector, emitter, and gate of the IGBT 2 are connected to a DC power supply terminal 6 via the inductive load 1, a ground GND1 that is set at a first reference potential G1, and the drive circuit 5, respectively.

The signal generation device 3 is configured with, for example, an ECU (engine control unit), is connected to a ground GND2 that has a second reference potential G2 that is separated from the first reference potential G1, and outputs a pulse-shaped control voltage that drives the IGBT 2.

The input determination circuit 4 compares an input signal voltage input from the signal generation device 3 with a reference voltage to determine a voltage level and outputs a determination result to the drive circuit 5.

The drive circuit 5 forms a gate signal applied to the IGBT 2 based on a determination signal input from the input determination circuit 4 and, in conjunction therewith, performs current limit control and protection control, such as self cut-off when an excessive current flows, of the IGBT 2.

Figure 2:
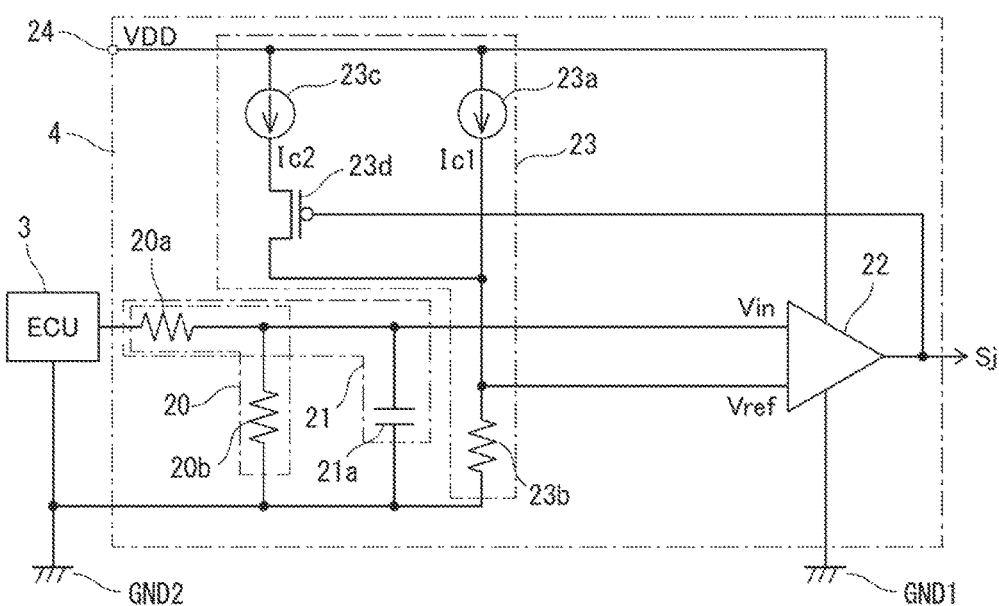
FIG. 2 is a circuit diagram illustrative of a first embodiment of an input determination circuit that is applicable to FIG. 1.

Next, the input determination circuit 4 is configured as illustrated in FIG. 2.

That is, the input determination circuit 4 includes a voltage divider circuit 20 for dividing an input voltage Vin that is input from the signal generation device 3, a first low pass filter 21 that uses a resistor in the voltage divider circuit 20 to remove noises in the input voltage Vin, a comparator 22 that compares an output voltage from the first low pass filter 21 with a reference voltage Vref, and a reference voltage generation circuit 23 that supplies the comparator 22 with the reference voltage Vref.

The voltage divider circuit 20 includes resistors 20a and 20b that are connected in series between the output side of the signal generation device 3 and the ground GND2. A divided voltage is output from the connection point between the resistors 20a and 20b.

The first low pass filter 21 has a configuration of a first order RC filter that is made up of the resistor 20a in the voltage divider circuit 20 and a capacitor 21a that is connected between the connection point between the resistor 20a and an input voltage terminal of the comparator 22 and the ground GND2. In the above, the capacitance of the capacitor 21a is set at, although depending on a needed cutoff frequency, a capacitance of approximately several pF to several hundreds of pF.

The comparator 22 is driven by being connected between a DC power supply terminal 24 that has a third potential VDD that is higher than the first reference potential G1 and the second reference potential G2 and the ground GND1, which has the first reference potential G1. The comparator 22 is supplied with a filter output voltage output from the first low pass filter 21 at an input voltage terminal thereof as the input voltage Vin and the reference voltage Vref output from the reference voltage generation circuit 23 at a reference voltage terminal thereof and outputs a low level determination signal Sj when Vin<Vref holds and a high level determination signal Sj when VinVref holds.

The reference voltage generation circuit 23 is connected between the DC power supply terminal 24, which has the third potential VDD, which is higher than the first reference potential G1 and the second reference potential G2, and the ground GND2, which has the second reference potential G2.

The reference voltage generation circuit 23 includes a series circuit that is made up of a first constant current source 23a and a resistor 23b that are connected in series between the DC power supply terminal 24 and the ground GND2 and a series circuit that is made up of a second constant current source 23c and a P-channel MOSFET 23d and is connected in parallel with the first constant current source 23a. In addition, the reference voltage Vref, which is output from the connection point among the first constant current source 23a, the P-channel MOSFET 23d, and the resistor 23b, is input to the reference voltage terminal of the comparator 22.

In the above, the source, drain, body terminal, and gate of the P-channel MOSFET 23d are connected to the second constant current source 23c, the connection point between the first constant current source 23a and the resistor 23b, the DC power supply terminal 24, and the output side of the comparator 22, respectively.

Therefore, the P-channel MOSFET 23d is brought to the ON state when the determination signal Sj output from the comparator 22 is at a low level and to the OFF state when the determination signal Sj is at a high level.

For this reason, when the P-channel MOSFET 23d is in the ON state, a constant current Ic1 from the first constant current source 23a and a constant current Ic2 from the second constant current source 23c flow through the resistor 23b, which causes the reference voltage Vref output from the reference voltage generation circuit 23 to become a reference voltage Vref1 that is, assuming that the resistance value of the resistor 23*b* is denoted by R0, expressed by the following equation:

$$Vref1 = (Ic1 + Ic2) \times R0$$

and is a reference voltage based on which an input signal is recognized to be in the ON state.

On the other hand, when the P-channel MOSFET 23*d* is in the OFF state, only the constant current Ic1 from the first constant current source 23*a* flows through the resistor 23*b*, which causes the reference voltage Vref to become a reference voltage Vref2 that is expressed by the following equation:

$$Vref2 = Ic1 \times R0$$

and is a reference voltage based on which an input signal is recognized to be in the OFF state.

Next, an operation of the above-described first embodiment will be described.

When, while the IGBT 2 is in the OFF state, an input signal output from the signal generation device 3 is reversed from a low level to a high level, the output signal from the signal generation device 3 is determined based on the voltage level thereof by the input determination circuit 4, and, when the output signal increases to the reference voltage Vref or higher, the determination signal Sj is reversed from a low level to a high level. The determination signal Sj is transmitted to the drive circuit 5 to make the IGBT 2 conduct, causing the inductive load 1 to be supplied with a current.

In this case, in the input determination circuit 4, since the input voltage Vin to the comparator 22 is lower than the reference voltage Vref while the input signal output from the signal generation device 3 is at the low level, the determination signal Sj output from the comparator 22 is kept at the low level.

Therefore, in the reference voltage generation circuit 23, since the determination signal Sj of a low level is supplied to the gate of the P-channel MOSFET 23*d*, the P-channel MOSFET 23*d* is in the ON state. For this reason, to the resistor 23*b*, a current Ic1+Ic2, which is the sum of the constant current Ic1 from the first constant current source 23*a* and the constant current Ic2 from the second constant current source 23*c*, is supplied. Therefore, the reference voltage at a time when the input signal turns from a low level to a high level is equal to the reference voltage Vref1 and is input to the reference voltage terminal of the comparator 22.

In this state, the input signal output from the signal generation device 3 being reversed from the low level to the high level causes the determination signal Sj to be reversed from the low level to the high level at a point of time when the input voltage Vin input to the comparator 22 in the input determination circuit 4 increases to the reference voltage Vref1 or higher.

When the determination signal Sj turns to the high level in this way, the P-channel MOSFET 23*d* in the reference voltage generation circuit 23 is brought to the OFF state, which causes only the constant current Ic1 from the first constant current source 23*a* to flow through the resistor 23*b*.

Therefore, the reference voltage Vref output from the reference voltage generation circuit 23 is switched from the reference voltage Vref1 to the reference voltage Vref2. For this reason, even when chattering occurs on the input voltage Vin, the determination signal Sj output from the comparator 22 is kept at the high level.

Subsequently, when the input signal output from the signal generation device 3 being reversed from the high level to the low level causes the input voltage Vin input to the input voltage terminal of the comparator 22 to decrease to lower than the reference voltage Vref2, the determination signal Sj is reversed from the high level to the low level. For this reason, the reference voltage Vref output from the reference voltage generation circuit 23 returns to the reference voltage Vref1, and, even when chattering occurs on the input voltage Vin, the determination signal Sj output from the comparator 22 is kept at the low level.

Therefore, in the input determination circuit 4, hysteresis properties are formed against the input voltage Vin, which enables a correct determination signal Sj to be obtained without being influenced by chattering.

Both the input voltage Vin and the reference voltage Vref, which are input to the comparator 22, are based on the second reference potential G2 of the ground GND2. For this reason, even when the second reference potential G2 fluctuates, a relationship between the input voltage Vin and the reference voltage Vref may be maintained correctly, and, within an in-phase input voltage range of the comparator, the input determination circuit may determine the input voltage Vin correctly.

Between an input voltage system to which an input signal output from the signal generation device 3 is input and the ground GND2 having the second reference potential G2, the first low pass filter 21 is connected. For this reason, when a surge voltage and a high frequency noise are superimposed on the input signal output from the signal generation device 3, noise components in such a surge voltage and a high frequency noise are discharged to the ground GND2 through the first low pass filter 21, which causes a relationship between the input voltage Vin and the reference voltage Vref applied to the comparator 22, that is, differential components, to become a signal voltage from which noise components have been removed.

Therefore, the comparator 22 may determine the levels of the input voltage Vin correctly without being influenced by noise components superimposed on an input signal.

As described above, removing a surge voltage and a high frequency noise superimposed on an input signal output from the signal generation device 3 only demands providing the low pass filter 21 to an input signal system connected to the comparator 22. In addition, since dividing voltages of an input signal by the voltage divider circuit 20 enables the in-phase input voltage range of the comparator 22 to be enlarged in a practical manner, the levels of an input voltage may be determined correctly even when a potential difference between the reference potential G1 and the reference potential G2 increases comparatively. Furthermore, the capacitance of the capacitor 21*a*, which composes a low pass filter with the resistor 20*a*, which also composes the voltage divider circuit 20, may be reduced to, for example, a capacitance of approximately several pF to several hundreds of pF, which makes it unnecessary to arrange the capacitor externally and enables an input determination circuit with a low pass filter added thereto to be arranged inside a semiconductor chip and to be miniaturized.

Next, a second embodiment of an input determination circuit 4 according to the present invention will be described using FIG. 3.

The second embodiment is an embodiment in which the first low pass filter based on the second reference potential in the afore-described first embodiment is omitted, and, in place of the first low pass filter, low pass filters based on a first reference potential that serves as a reference potential for a comparator are added.

Figure 3:
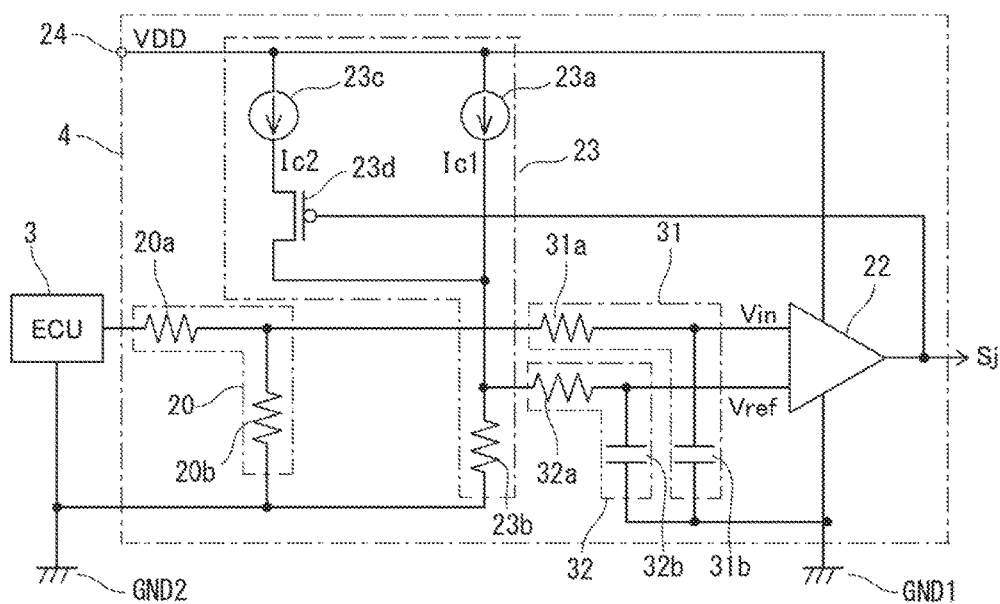
FIG. 3 is a circuit diagram illustrative of a second embodiment of the input determination circuit.

That is, in the second embodiment, the input determination circuit 4 is configured in such a way that, as illustrated in FIG. 3, the capacitor 21a composing the first low pass filter 21 in the first embodiment is omitted, and, in place of the first low pass filter 21, a second low pass filter 31 and a third low pass filter 32 are added immediately before an input voltage terminal and reference voltage terminal of a comparator 22, respectively.

Since the other configuration is the same as the configuration of the afore-described first embodiment, the same signs are assigned to the same components as those in FIG. 1 and a detailed description thereof will be omitted.

In the second embodiment, the second low pass filter 31 is configured to form a first order RC filter with a resistor 31a that is connected between the connection point between resistors 20a and 20b of a voltage divider circuit 20 and the input voltage terminal of the comparator 22 and a capacitor 31b that is connected between the connection point between the resistor 31a and the input voltage terminal of the comparator 22 and a ground GND1 having a first reference potential G1.

In addition, the third low pass filter 32 is configured to form a first order RC filter with a resistor 32a that is connected between the connection point among a first constant current source 23a, a P-channel MOSFET 23d, and a resistor 23b of a reference voltage generation circuit 23 and the reference voltage terminal of the comparator 22 and a capacitor 32b that is connected between the connection point between the resistor 32a and the reference voltage terminal of the comparator 22 and the ground GND1, which has the first reference potential G1.

In the second embodiment, although the input determination circuit 4 performs the same basic operation as that in the afore-described first embodiment, when noise components of a surge voltage and a high frequency noise are superimposed on an input voltage system and a reference voltage system both of which are connected to the comparator 22, the noise components can be discharged to the shared ground GND1, which has the first reference potential G1.

Therefore, noise components superimposed on the input voltage system and the reference voltage system, which are input to the comparator 22, may be securely removed immediately before the comparator 22. In addition, setting the constant of the resistor 31a and the capacitor 31b, which compose the filter 31, and the constant of the resistor 32a and the capacitor 32b, which compose the filter 32, at an identical value enables the relationship in potentials between an input voltage and a reference voltage to be maintained against transient potential variations in the reference potential G1 and a reference potential G2. That is, since it is possible to make the input determination circuit 4 have resistance against in-phase noises, more correct and stable input determination may be performed.

Next, an input determination circuit according to a third embodiment of the present invention will be described using FIG. 4.

The third embodiment is an embodiment in which the first low pass filter in the afore-described first embodiment and the second low pass filter and the third low pass filter in the afore-described second embodiment are all added to the input determination circuit.

Figure 4:
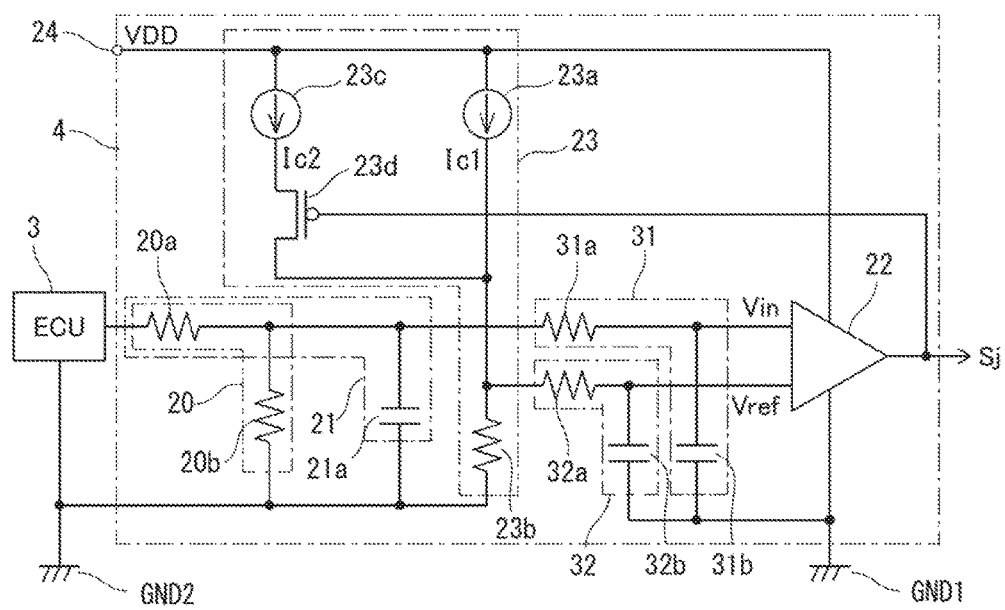
FIG. 4 is a circuit diagram illustrative of a third embodiment of the input determination circuit.

That is, in the third embodiment, as illustrated in FIG. 4, a first low pass filter 21 is connected between an input voltage system on the input side, which is close to a signal generation device 3, of an input determination circuit 4 and a ground GND2 having a second reference potential G2.

In addition, a second low pass filter 31 is connected between the input voltage system on the input side of a comparator 22 in the input determination circuit 4 and a ground GND1 having a first reference potential G1.

Furthermore, a third low pass filter 32 is connected between a reference voltage system on the input side of the comparator 22 in the input determination circuit 4 and the ground GND1, which has the first reference potential G1.

Since the other configuration is the same as the configurations of the afore-described first and second embodiments, the same signs are assigned to the same components as those in FIGS. 1 and 3 and a detailed description thereof will be omitted.

According to the third embodiment, the first low pass filter 21 is connected on the signal generation device 3 side of the input determination circuit 4, the second low pass filter 31 is connected to the input voltage terminal side on the input side of the comparator 22, and the third low pass filter 32 is connected to the reference voltage terminal side on the input side of the comparator 22. For this reason, regarding noise components of a surge voltage, a high frequency noise, and the like that are superimposed on the input voltage system and the reference voltage system, which are input to the comparator 22, both differential components and in-phase components may be securely removed, which enables input determination with high accuracy to be performed without being influenced by noise.

Next, an input determination circuit according to a fourth embodiment of the present invention will be described using FIG. 5.

The fourth embodiment is an embodiment in which the switching element that selects connection of the second constant current source of the reference voltage generation circuit in the first to third embodiments is changed.

Figure 5:
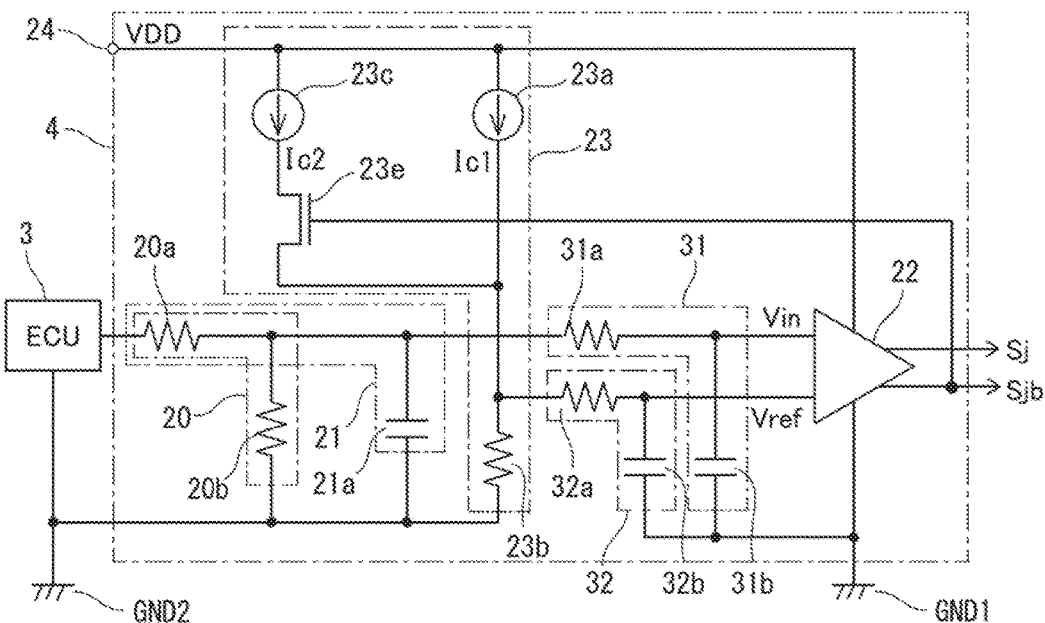
FIG. 5 is a circuit diagram illustrative of a fourth embodiment of the input determination circuit.
Figure 6:
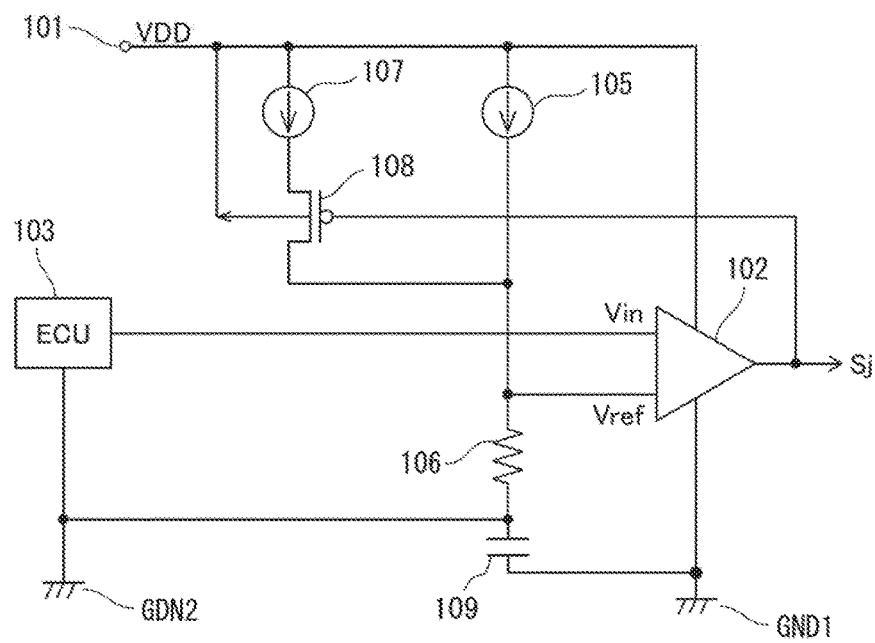
FIG. 6 is a circuit diagram illustrative of a conventional example of a semiconductor device.

That is, in the fourth embodiment, as illustrated in FIG. 5, the P-channel MOSFET 23d of the reference voltage generation circuit 23 of the input determination circuit 4 in the above-described third embodiment is replaced with an N-channel MOSFET 23e. In conjunction with the replacement, an output terminal from which a reverse phase determination signal Sjb having a reverse phase to that of a determination signal Sj is output is added on the output side of a comparator 22, and the reverse phase determination signal Sjb is supplied to the gate of the N-channel MOSFET 23e.

In the fourth embodiment, the configuration is the same as the configuration illustrated in FIG. 4 except that the semiconductor switching element that selects connection of the second constant current source 23c of the reference voltage generation circuit 23 in the third embodiment is changed to the N-channel MOSFET 23e. For this reason, a noise removal function that is the same as the one in the afore-described third embodiment may be achieved.

In addition, although the configuration including the P-channel MOSFET 23d for obtaining hysteresis property of an input determination circuit 4 is changed to a configuration including the N-channel MOSFET 23e, a terminal that outputs the determination signal Sjb having a reverse phase to that of the determination signal Sj is added to the comparator 22 and the reverse phase determination signal Sjb is supplied to the gate of the N-channel MOSFET 23e.

Therefore, when the determination signal Sj of the comparator 22 is at a low level, the reverse phase determination signal Sjb becomes a high level, which causes the N-channel MOSFET 23e to be brought to the ON state. For this reason, the reference voltage Vref1 may be obtained from the reference voltage generation circuit 23.

Conversely, when the determination signal Sj from the comparator is reversed from the low level to the high level, the reverse phase determination signal Sjb becomes the low level, which causes the N-channel MOSFET 23e to be brought to the OFF state. For this reason, the reference voltage Vref2 may be obtained from the reference voltage generation circuit 23.

Although, in the above-described fourth embodiment, a case in which an output terminal that outputs the reverse phase determination signal Sjb is added to the comparator 22 was described, the fourth embodiment is not limited to the case, and the determination signal Sj may be supplied to the gate of the N-channel MOSFET 23e via a NOT circuit (inverter) that serves as a logic inverter circuit.

Although, in the above-described second to fourth embodiments, cases in which the capacitors 31b and 32b of the second low pass filter 31 and the third low pass filter 32 are used were described, parasitic gate capacitance of MOSFETs composing the comparator 22 may also be applied in place of the capacitors 31b and 32b.

Furthermore, although, in the above-described first to fourth embodiments, cases in which a current flowing through the inductive load 1 is controlled by connecting the IGBT 2 to the inductive load 1 in series were described, the first to fourth embodiments are not limited to the case, and the connection point between the power source terminal and the collector of the IGBT 2 may be connected to the inductive load.

In addition, in the above-described first to fourth embodiments, the signal generation device 3 may be configured to have a configuration of, without being limited to an engine control device, another arbitrary signal generation device, a control signal to be output is not limited to a pulse-shaped signal also, and any signal form, such as a sinusoidal signal and a triangular wave signal may be applied.

Furthermore, although, in the above-described first to fourth embodiments, cases in which the input determination circuit 4 has hysteresis property were described, the first to fourth embodiments are not limited to the case, and, by omitting the second constant current source 23c and the P-channel MOSFET 23d or the N-channel MOSFET 23e, an input determination circuit without hysteresis property may be configured.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

REFERENCE SIGNS LIST

1 Inductive load
2 IGBT
3 Signal generation device
4 Input determination circuit
5 Drive circuit
GND1, GND2 Ground
20 Voltage divider circuit
20a, 20b Resistor
21 First low pass filter
21a Capacitor
22 Comparator
23 Reference voltage generation circuit
23a First constant current source
23b Resistor
23c Second constant current source
23d P-channel MOSFET
23e N-channel MOSFET
24 DC power supply terminal
31 Second low pass filter
31a Resistor
31b Capacitor
32 Third low pass filter
32a Resistor
32b Capacitor

The invention claimed is:

1. A semiconductor device comprising
an input determination circuit including:
   a comparator that is driven based on a first reference potential and includes an input voltage terminal and a reference voltage terminal;
   a reference voltage generation circuit that inputs a reference voltage that is generated from a connection point between a constant current source and a resistor to the reference voltage terminal of the comparator, the constant current source and the resistor being interposed between a second reference potential that is separated from the first reference potential and a third potential that is higher than the first reference potential and the second reference potential; and
   a first low pass filter that is interposed between a signal input system that is connected to the input voltage terminal of the comparator and the second reference potential.

2. A semiconductor device comprising
an input determination circuit that includes:
   a comparator that is driven based on a first reference potential and includes an input voltage terminal and a reference voltage terminal;
   a reference voltage generation circuit that inputs a reference voltage that is generated from a connection point between a constant current source and a resistor to the reference voltage terminal of the comparator, the constant current source and the resistor being interposed between a second reference potential that is separated from the first reference potential and a third potential that is higher than the first reference potential and the second reference potential;
   a second low pass filter that is interposed between a signal input system that is connected to the input voltage terminal of the comparator and the first reference potential; and
   a third low pass filter that is interposed between a reference voltage system between the reference voltage generation circuit and the reference voltage terminal and the first reference potential.

3. A semiconductor device comprising
an input determination circuit that includes:
   a comparator that is driven based on a first reference potential and includes an input voltage terminal and a reference voltage terminal;
   a reference voltage generation circuit that inputs a reference voltage that is generated from a connection point between a constant current source and a resistor to the reference voltage terminal of the comparator, the constant current source and the resistor being interposed between a second reference potential that is separated from the first reference potential and a third potential that is higher than the first reference potential and the second reference potential;

a first low pass filter that is interposed between a signal input system that is connected to the input voltage terminal of the comparator and the second reference potential;

a second low pass filter that is interposed between the signal input system and the first reference potential; and a third low pass filter that is interposed between a reference voltage system between the reference voltage generation circuit and the reference voltage terminal and the first reference potential.

4. The semiconductor device according to claim 1, wherein a series circuit of a second constant current source and a switching element is connected in parallel with the constant current source, the switching element being controlled with an output signal from the comparator, so as to obtain a hysteresis property.

5. The semiconductor device according to claim 4, wherein
the switching element is configured with either one of a P-channel MOSFET and an N-channel MOSFET.

6. The semiconductor device according to claim 2, wherein a series circuit of a second constant current source and a switching element is connected in parallel with the constant current source, the switching element being controlled with an output signal from the comparator, so as to obtain a hysteresis property.

7. The semiconductor device according to claim 6, wherein
the switching element is configured with either one of a P-channel MOSFET and an N-channel MOSFET.

8. The semiconductor device according to claim 3, wherein a series circuit of a second constant current source and a switching element is connected in parallel with the constant current source, the switching element being controlled with an output signal from the comparator, so as to obtain a hysteresis property.

9. The semiconductor device according to claim 8, wherein
the switching element is configured with either one of a P-channel MOSFET and an N-channel MOSFET.

* * * * *